US012392810B2

(12) United States Patent
Guillet De Chatellus

(10) Patent No.: US 12,392,810 B2
(45) Date of Patent: Aug. 19, 2025

(54) DEVICE FOR WIDE-BAND SPECTRAL ANALYSIS OF A SIGNAL OF INTEREST

(71) Applicants: CENTRE NATIONAL DE LA RECHERCHE SCIENTIFIQUE, Paris (FR); UNIVERSITE GRENOBLE ALPES, Saint Martin d'Heres (FR)

(72) Inventor: Hugues Guillet De Chatellus, Saint Martin d'Heres (FR)

(73) Assignees: CENTRE NATIONAL DE LA RECHERCHE SCIENTIFIQUE, Paris (FR); UNIVERSITE GRENOBLE ALPES, Saint Martin d'Heres (FR)

( * ) Notice: Subject to any disclaimer, the term of this patent is extended or adjusted under 35 U.S.C. 154(b) by 260 days.

(21) Appl. No.: 18/039,205

(22) PCT Filed: Dec. 3, 2021

(86) PCT No.: PCT/EP2021/084245
§ 371 (c)(1),
(2) Date: May 26, 2023

(87) PCT Pub. No.: WO2022/122594
PCT Pub. Date: Jun. 16, 2022

(65) Prior Publication Data
US 2023/0417810 A1    Dec. 28, 2023

(30) Foreign Application Priority Data
Dec. 7, 2020   (FR) ..................................... 2012783

(51) Int. Cl.
H04B 10/64    (2013.01)
G01J 3/12     (2006.01)
G01R 23/165   (2006.01)

(52) U.S. Cl.
CPC .......... G01R 23/165 (2013.01); G01J 3/1256 (2013.01); H04B 10/64 (2013.01)

(58) Field of Classification Search
None
See application file for complete search history.

(56) References Cited

U.S. PATENT DOCUMENTS 7,292,791 B2 * 11/2007 Sayyah .................. H04B 10/64
                                                      398/183
10,234,706 B2 * 3/2019 Guillet De Chatellus ...............
                                                      H01S 3/0057

(Continued)

FOREIGN PATENT DOCUMENTS

CN    110 022 176 A    7/2019

OTHER PUBLICATIONS

Duran et al., Coherent multi-heterodyne spectroscopy using acousto-optic frequency combs, 2018 (Year: 2018).*

(Continued)

Primary Examiner — Jai M Lee
(74) Attorney, Agent, or Firm — Maier & Maier, PLLC

(57) ABSTRACT

A wideband device for the spectral analysis of a signal of interest includes a source designed to generate the signal of interest; an optical splitter element designed to spatially split the signal of interest into a first signal and a second signal; a first frequency-shifting optical cavity comprising a first frequency shifter designed to shift the optical frequency of the first signal by a first frequency $f_1$ per round trip in the first cavity, the first cavity having a first trip time $\tau_1$; a second frequency-shifting optical cavity comprising a second frequency shifter designed to shift the optical frequency of the second signal by a second frequency $f_2$ per round trip in the second cavity, the second cavity having a second trip time $\tau_2$; the first and the second optical cavity being designed such that a maximum number of round trips of the signal in the first and the second cavity is equal to predetermined N; a detector designed to coherently detect the first signal transmitted by the first cavity and the second signal transmitted by the second cavity and generate a photocurrent proportional to a luminous intensity detected by the detector, an analog low-pass filter designed to filter frequencies of the photocurrent that are lower than min $(f_1/2, f_2/2)$ a processor (Continued)

configured to compute a square modulus of the photocurrent filtered by the low-pass filter, from which a temporal representation of frequency information of the signal of interest is determined.

12 Claims, 5 Drawing Sheets

(56) References Cited

U.S. PATENT DOCUMENTS

| | | | |
|---|---|---|---|
| 11,366,012 B2* | 6/2022 | Azana | G01J 11/00 |
| 12,078,527 B2* | 9/2024 | Jiang | G01D 5/35329 |
| 2024/0007188 A1* | 1/2024 | Guillet De Chatellus | H04B 10/2557 |

OTHER PUBLICATIONS

Guillet De Chatellus, et al., "Optical real-time Fourier transformation with kilohertz resolutions", Optica 3.1, 2016.

Schnébelin, et al., "Agile photonic fractional Fourier transformation of optical and RF signals," Optica 4, pp. 907-910, 2017.

Duran, et al., "Coherent multi-heterodyne spectroscopy using acousto-optic frequency combs," Opt. Express, vol. 26, No. 11, pp. 13800-13809, 2018.

Guillet De Chatellus, et al., "Real-Time Fourier Transformation with kHz Resolution", Optics and Photonics News, vol. 27 (12), 51-51, 2016.

Bosch, et al., "Self-heterodyne and dual-comb spectroscopy using acousto-optic frequency combs", 2018 Conference on Lasers and Electro-Optics (CLEO), OSA, 2018.

Guillet De Chatellus, et al., "Optical real-time Fourier transformation with kilohertz resolutions", Optica, vol. 3, No. 1, Jan. 2016.

Schnébelin, et al., "Agile photonic fractional Fourier transformation of optical and RF signals", Optica, vol. 4, No. 8, pp. 907-910, 2017.

* cited by examiner

DEVICE FOR WIDE-BAND SPECTRAL ANALYSIS OF A SIGNAL OF INTEREST

CROSS-REFERENCE TO RELATED APPLICATIONS

This application is a National Stage of International patent application PCT/EP2021/084245, filed on Dec. 3, 2021, which claims priority to foreign French patent application No. FR 2012783, filed on Dec. 7, 2020, the disclosures of which are incorporated by reference in their entirety.

FIELD OF THE INVENTION

The invention relates to the field of the analog processing of optical and radiofrequency signals, and more particularly to the analog processing of wideband optical and radiofrequency signals using frequency-shifting optical cavities.

BACKGROUND

Knowledge of the spectrum of a signal of interest is essential in many applications such as spectrometry, electromagnetic compatibility, location of transmitters and signal interception, navigation, and geophysical and astronomical observation.

In the optical field, spectral analysis is typically performed using three types of devices.

A first solution consists in diffracting the optical signal using a grating. The far-field illumination gives the spectrum. These grating-based spectrometers are widely used owing to their simplicity and their low cost. On the other hand, their frequency resolution is no better than around ten GHz.

Another technique allowing a better spectral resolution (a few GHz) is that of Fourier transform (FT) spectral analysis, which consists in using a Michelson interferometer. The delay of the interferometer varies over time, by virtue of a mirror mounted on a mobile carriage. The fringes (that is to say the interferogram) are recorded over time. An FT operation then makes it possible to access the spectrum. This is the basic principle of commercial OSA ("optical spectrum analyzers"). There are two limits to this device: the spectral resolution is given by the maximum path difference of the interferometer. In practice, this resolution is of the order of GHz. Moreover, the time needed to measure a spectrum is of the order of a second. The technique is therefore reserved for long enough optical signals, or optical signals whose spectrum is constant overtime. Indeed, the probability of interception or POI (that is to say the probability of a signal actually being measured by the spectral analyzer) of such a device is low.

A third technique is that of heterodyne spectral analysis. This technique has a spectral resolution of a few MHz and makes it possible to measure spectra with a high resolution. This involves using a continuous-wave laser with a narrow linewidth (sub MHz), and frequency-scanning it. The amplitude of the heterodyne beat at a given frequency of this laser with the optical signal to be analyzed during the frequency ramp therefore provides the spectrum thereof. However, this technique is expensive, requires a reference laser, and has a low POI.

In the field of radiofrequency (RF) signals, there are two kinds of current commercial solutions for spectral analysis of RF signals: real-time spectrum analyzers and scanning analyzers.

The scanning analyzer operates by comparing (heterodyning) the SUT ("signal under test") with a reference signal whose frequency is varied over time (for example by a frequency ramp). It makes it possible to measure spectral widths greater than 20 GHz. However, due to the duration of the frequency ramp, this technique detects, at a given time, only a very small part of the spectrum. For the scanning analyzer, the POI is typically 1%. It is therefore not suitable for analyzing short signals or signals whose spectrum varies over time.

Real-time analyzers combine a signal acquisition step, called analog-to-digital conversion—and a digital computing step (Fourier transform). The first step is particularly critical for the faithfulness of the process: indeed, it is necessary to sample the SUT twice as fast as its maximum frequency (Nyquist criterion). A sampling rate that is too low therefore results in a loss of information from the high frequencies of the SUT. Now, the sampling frequency of analog-to-digital converters is intrinsically limited to a few Gsample/s. Therefore, the best real-time spectrum analyzers do not make it possible to achieve spectral widths greater than GHz. They also mobilize a very large amount of computing resources to compute the spectrum in real time.

Moreover, the document "Hugues Guillet de Chatellus, Luis Romero Cortés, and José Azaña. "Optical real-time Fourier transformation with kilohertz resolutions." *Optica* 3.1 (2016): 1-8", describes a device comprising a frequency-shifting loop into which a signal of interest is injected. The device described in that document makes it possible to generate, at output, a temporal signal that reproduces the spectrum of the input signal, on the condition that $f_1 \tau_1$ is an integer, where $f_1$ is the shift frequency of the signal of interest per round trip in the loop and $\tau_1$ is the duration of a round trip of the signal of interest in the loop. FIG. 1 schematically shows the device described in the abovementioned document. The device comprises a source S0 generating an optical signal or an RF signal carried by (that is to say amplitude-modulated by) an optical signal, so as to form a signal of interest. "Carried by" is understood to mean here and in the remainder of the document that the carrier signal is amplitude-modulated by the modulating signal. This signal of interest is injected into the fiber frequency-shifting loop BDF0 via a fiber coupler C0. The loop BDF0 comprises a frequency shifter AOM0 (for example an acousto-optic modulator) designed to shift the optical frequency of the signal by a frequency $f_1$ per round trip in the loop. The loop BDF0 furthermore comprises an amplifier EDFA0 (for example a doped fiber amplifier, such as an EDFA, for Erbium Doped Fiber Amplifier) in order to compensate for the losses induced by the loop, and an optical bandpass filter BP0 in order to limit the noise resulting from the amplified spontaneous emission of the amplifier and to set the number of round trips in the loop. The radiation transmitted by the loop is detected by a photodiode PD0 generating a photocurrent that is filtered by an analog low-pass filter LP0 designed to retain only frequencies of the photocurrent that are lower than the Nyquist frequency of the signal of interest. A processor UT is configured to compute the square modulus of the photocurrent. When $f_1 \tau_1$ is an integer, the time trace obtained after processing of the photocurrent by the processor is the power spectrum of the optical signal if the signal of interest is an optical signal, or the power spectrum of the RF signal if the signal of interest is an RF signal carried by a coherent optical signal.

This system exhibits significant technological limitations. First of all, the spectral width of the signal of interest must be less than $1/\tau_1$ (that is to say of the order of 10 MHz), thereby greatly limiting practical applications. It is not possible here to increase $\tau_1$ so as to achieve a bandwidth of the order of ten GHz, due to the complexity and the propagation losses that this would entail. The other constraint is that the period of the output signal (the spectrum) is $1/f_1$, this meaning that the output signal has to be sampled at $Nf_1$, that is to say at a few tens of Gsample/s (taking N=300 and $f_1$=80 MHz).

Moreover, the device from the prior art in FIG. 1 makes it possible to compute the fractional Fourier transform of a signal of interest when $f_1\tau_1$, is close to an integer. This property is described in the document: Côme Schnébelin and Hugues Guillet de Chatellus, "Agile photonic fractional Fourier transformation of optical and RF signals," Optica 4, 907-910 (2017). The fractional Fourier transform (FrFT) is a generalization of the Fourier transform (FT) to any intermediate domain (called fractional domain) between direct space and Fourier space. This transformation may be likened to a rotation in the time-frequency domain. Writing the conventional Fourier transformation of a function $f$ in the form $$F_{\frac{\pi}{2}}(f)$$

makes it possible to generalize this writing for any fractional order $\alpha$. The fractional Fourier transformation (FrFT) of order $\alpha$ will therefore be: $F_\alpha(f)$. The FrFT is relevant for analyzing input signals whose frequency varies linearly over time (signals with linear frequency modulation, or "chirps").

For $\alpha=0$, the identity operator is found and the result would give the function $f$. For $\alpha=\pi/2$, the conventional Fourier transformation is found. For $\alpha \in \mathbb{R}$ and with u being the variable in the target domain called fractional domain, the FrFT of order $\alpha$ of the function $f$ may be expressed in the form:

$$F_\alpha[f(x)](u) = \sqrt{1-i\cot(\alpha)}\, e^{i\pi \cot(\alpha)u^2} \int_{-\infty}^{+\infty} e^{-i2\pi\left(\csc(\alpha)ux - \frac{\cot(\alpha)}{2}x^2\right)} f(x)dx$$

SUMMARY OF THE INVENTION

The invention aims to overcome some of the abovementioned problems of the prior art by proposing a device for the spectral analysis of a wideband signal of interest implementing two frequency-shifting cavities.

To this end, one subject of the invention is a wideband device for the spectral analysis of a signal of interest comprising:
- a source designed to generate said signal of interest;
- an optical splitter element designed to spatially split said signal of interest into a first signal and a second signal;
- a first frequency-shifting optical cavity comprising a first frequency shifter designed to shift the optical frequency of the first signal by a first frequency $f_1$ per round trip in said first cavity, said first cavity having a first trip time $\tau_1$;
- a second frequency-shifting optical cavity comprising a second frequency shifter designed to shift the optical frequency of the second signal by a second frequency $f_2$ per round trip in said second cavity, said second cavity having a second trip time $\tau_2$;
- the first and the second optical cavity being designed such that a maximum number of round trips of said signal in the first and the second cavity is equal to predetermined N;
- a detector designed to coherently detect the first signal transmitted by the first cavity and the second signal transmitted by the second cavity and generate a photocurrent proportional to a luminous intensity detected by said detector,
- a low-pass filter designed to filter frequencies of the photocurrent that are lower than min ($f_1/2$, $f_2/2$),
- a processor configured to compute a square modulus of the photocurrent filtered by said low-pass filter, from which a temporal representation of frequency information of said signal of interest is determined.

According to some particular modes of the invention:
- said source comprises a monochromatic continuous-wave laser, an RF source designed to generate an RF signal s(t), and a modulator designed to amplitude-modulate or phase-modulate, using said RF signal s(t), laser radiation generated by said continuous-wave laser, so as to form said signal of interest;
- the first cavity and the second cavity are configured to verify the condition $f_1 \times \tau_1 \neq f_2 \times \tau_2$, said frequency information then being a real part of a fractional Fourier transform of said signal of interest, an order of said fractional Fourier transform being set by the value $f_1 \times \tau_1 - f_2 \times \tau_2$;
- the first cavity and the second cavity are configured to verify the condition $f_1 \times \tau_1 = f_2 \times \tau_2$ modulo 1, said frequency information then being a power spectrum of said signal of interest;
- the analog low-pass filter is designed to filter frequencies of said photocurrent that are lower than min [$N \times |f_1 - f_2|$; $f_1/2$; $f_2/2$],
- the first and the second cavity respectively comprise a first and a second amplifier that are designed to compensate for the losses induced respectively by the first and the second cavity,
- the first frequency shifter is a first acousto-optic modulator excited by a first local oscillator designed to vary said first shift frequency and wherein the second frequency shifter is a second acousto-optic modulator excited by a second local oscillator designed to vary said second shift frequency;
- the first cavity comprises a first controllable delay line designed to vary the first trip time $\tau_1$ and wherein the second cavity comprises a second controllable delay line designed to vary the second trip time $\tau_2$;
- the first and the second cavity are fiber ring cavities comprising respectively a first and a second doped fiber amplifier and a first and a second optical bandpass filter configured to set said maximum number N of round trips in the first and the second cavity;
- the device comprises stabilizing means for stabilizing the first and the second cavity that are designed to maintain, over time, the coherence of said first signal transmitted by the first cavity with said second signal transmitted by the second cavity;
- the device comprising a single ring cavity, said device furthermore comprising:
  - a first coupler designed to inject said first signal into said single cavity in a first direction,
  - a second coupler designed to inject said second signal into said single cavity in a second direction, said first cavity corresponding to the single cavity into which the first signal is injected in the first injection direction, said second cavity corresponding to the single cavity into which the second signal is injected in the second injection direction, said single ring cavity comprising:
- a first circulator designed to direct the first signal to a first controllable delay line designed to vary the first trip timer, and comprising said first frequency shifter,
- a second circulator designed to direct the second signal to a second controllable delay line designed to vary the second trip timer, and comprising said second frequency shifter,
- a doped fiber amplifier,
- an optical bandpass filter configured to set said maximum number N of round trips,
- the first and the second cavity are configured such that $$\frac{1}{|\tau_1 - \tau_2|} \geq 40 \text{ GHz};$$

the first and the second cavity are configured such that N is greater than 200.

Another subject of the invention is a method for the spectral analysis of a signal of interest using a first frequency-shifting optical cavity comprising a first frequency shifter having a first trip time $\Sigma_1$ and a second frequency-shifting optical cavity comprising a second frequency shifter having a second trip time $\tau_2$, a maximum number of round trips of said signal of interest in the first and the second cavity being equal to predetermined N, said method comprising the following steps:

A. generating said signal of interest;
B. spatially splitting said signal of interest into a first signal and a second signal;
C. injecting said first signal into the first frequency-shifting optical cavity and shifting the optical frequency of the first signal by a first frequency $f_1$ per round trip in said first cavity
D. injecting said second signal into the second frequency-shifting optical cavity and shifting the optical frequency of the second signal by a second frequency $f_2$ per round trip in said second cavity;
E. coherently detecting the first signal transmitted by the first cavity and the second signal transmitted by the second cavity and generating a photocurrent proportional to a detected luminous intensity,
F. filtering frequencies of the photocurrent that are lower than min $(f_1/2, f_2/2)$,
G. computing a square modulus of the filtered photocurrent and determining a temporal representation of frequency information of said signal of interest.

According to some particular modes of the method of the invention:
the method comprises a step prior to step A, denoted step A0, of adjusting the first or the second cavity in order to set the difference $f_1 \times \tau_1 - f_2 \times \tau_2$ to a desired non-zero value, in order to compute, in step G, a specific order of a real part of a fractional Fourier transform of the signal of interest,
the method comprises a step prior to step A, denoted step A0, of adjusting the first or the second cavity in order to cancel out the difference $f_1 \times \tau_1 - f_2 \times \tau_2$, in order to compute, in step G, a power spectrum of said signal of interest.

BRIEF DESCRIPTION OF THE DRAWINGS

Other features, details and advantages of the invention will become apparent upon reading the description, given with reference to the appended drawings, which are given by way of example and in which, respectively.

References to the figures, when they are identical, correspond to the same elements.

The elements are not to scale in the figures unless indicated otherwise.

DETAILED DESCRIPTION

Figure 2:
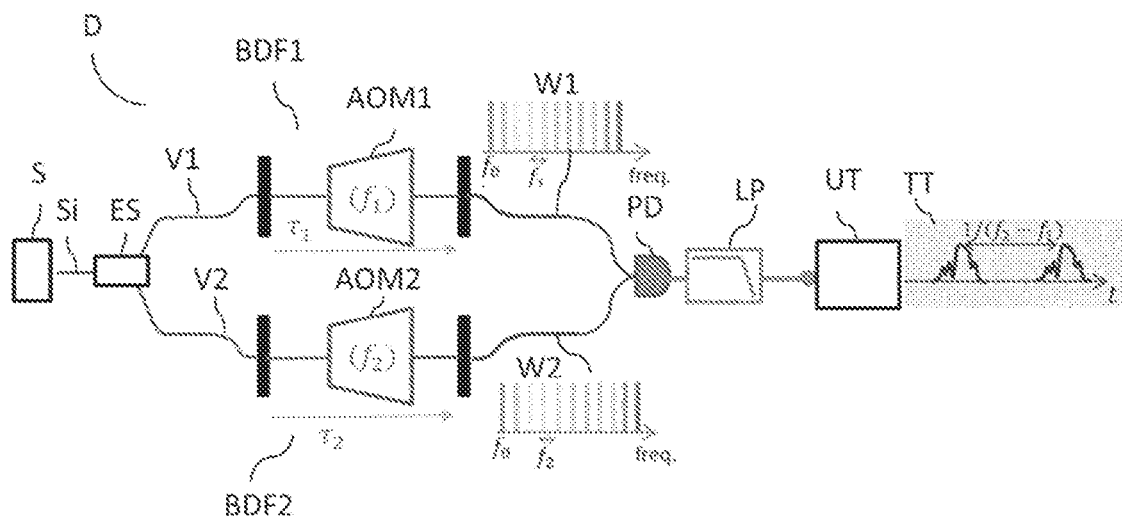
FIG. 2 shows a schematic view of a wideband spectral analysis device according to the invention.

FIG. 2 is a schematic depiction of a device D for wideband spectral analysis of a signal of interest according to the invention. As will be explained later, by virtue of a first frequency-shifting optical cavity BDF1 and a second frequency-shifting optical cavity BDF2, the device D of the invention makes it possible to determine a temporal representation of frequency information of the signal of interest. According to certain conditions linking these cavities, this temporal representation of the frequency information is the real part of a fractional transform or a power spectrum of the signal of interest.

"Wideband" is understood here to mean that the bandwidth of the device is greater than or equal to 20 GHz, preferably greater than or equal to 40 GHz. The parameters controlling the bandwidth of the device will be explained later in the description.

The device D of the invention comprises a radiation source S designed to generate the signal of interest Si. An optical splitter element ES of the device is designed to spatially split the signal of interest into a first signal V1 and a second signal V2.

According to one embodiment, the optical path of the signal of interest at the output of the source S is a fiber path and the element ES is a 1×2 fiber coupler (also called Y coupler). As an alternative, according to another embodiment, the optical path of the signal of interest at the output of the source S is a free-space optical path and the splitter element ES is a beam splitter or a splitter cube.

The first signal V1 is injected into the first frequency-shifting optical cavity BDF1. This cavity BDF1 has a first trip timer, (round trip time in the cavity) and comprises a first frequency shifter AOM1 designed to shift the optical frequency of the first signal by a first frequency $f_1$ per round trip in the first cavity.

Similarly, the second signal V2 is injected into the second frequency-shifting optical cavity BDF2, which has a second trip time $\tau_2$ and which comprises a second frequency shifter AOM2 designed to shift the optical frequency of the second signal by a second frequency $f_2$ per round trip in the second cavity.

The first optical cavity BDF1 and the second optical cavity BDF2 may, indiscriminately and without departing from the scope of the invention, be a linear cavity or a ring cavity, and a free-space cavity or a fiber cavity.

Essentially, the first and the second optical cavity are designed such that a maximum number of round trips of the signal in the first and the second cavity is equal to a predetermined number N. Thus, calling $f_0$ the center frequency of the signal of interest, the first and the second cavity each generate a frequency comb comprising respectively the frequencies $f_0+n\times f_1$ and $f_0+n\times f_2$, with $n\in[1;N]$. In concrete terms, the first and the second cavity produce replicas of the signal of interest, which are both time-shifted (by multiples of $\tau_1$ and $\tau_2$ respectively) and frequency-shifted (by multiples of $f_1$ and $f_2$ respectively).

According to one embodiment, in order to control this maximum number of round trips N, the first and the second loop respectively comprise a first and a second bandpass filter BP1, BP2 (not shown in FIG. 2 but visible in FIGS. 5 and 6), of bandwidth suitable for transmitting respectively the frequencies $f_0+n\times f_1$ and $f_0+n\times f_2$, with $n\in[1;N]$.

The first frequency shifter AOM1 and the second frequency shifter AOM2 are preferably acousto-optic modulators controlled by a first local oscillator OL1 and a second local oscillator OL2 (not shown in the figures). The excitation frequency generated by the first local oscillator and the second local oscillator makes it possible to vary the first frequency $f_1$ and the second frequency $f_2$. As an alternative, the first and the second frequency shifter are single-sideband electro-optic modulators (or SSB MZM, for single-sideband Mach Zehnder modulator).

The device D furthermore comprises a detector PD designed to coherently detect the first signal W1 transmitted by the first cavity and the second signal W2 transmitted by the second cavity. The detector PD is typically a photodiode or any other photodetector known to those skilled in the art. Preferably, the detector PD is formed by balanced photodiodes in order to detect very small light signal variations.

This detector PD detects, in real time, a luminous intensity that corresponds to the coherent summation of all replicas of the signal of interest that are both time-shifted and frequency-shifted (the frequency combs) by the first and the second cavity, and then generates a photocurrent Tr proportional to this detected luminous intensity. For the device to work, it is essential that the first signal W1 transmitted by BDF1 is coherent with the signal W2 transmitted by BDF2.

The photocurrent Tr is then filtered by a low-pass analog filter LP designed to let through frequencies of the photocurrent that are lower than the Nyquist frequencies associated with the first signal W1 and with the second signal W2, that is to say min $(f_1/2; f_2/2)$.

Finally, the device D comprises a processor UT configured to compute a square modulus of the photocurrent filtered by the filter LP, thus generating a time trace TT. By way of this trace TT, the device D makes it possible to determine a temporal representation of frequency information of the signal of interest.

In the device D of the invention, the bandwidth is equal to $LS_{in}=1/(\tau_1-\tau_2)$. This characteristic is of great interest because, by minimizing the difference $\tau_1-\tau_2$, it is possible to maximize the bandwidth of the device D.

The inventors have demonstrated that, depending on the value of the difference $f_1\times\tau_1-f_2\times\tau_2$, the trace TT is the real part of the fractional Fourier transform or a power spectrum of the signal of interest. For the sake of clarity, the derivation of the equations explaining this result are presented at the end of this description.

Thus, according to a first variant of the invention, the first cavity and the second cavity are configured to verify the condition $f_1\times\tau_1=f_2\times\tau_2$ (modulo 1). In this first variant, the photocurrent Tr is a temporal representation of the real part of the Fourier transform of the signal of interest ($\alpha=\pi/2$) and the trace TT is then a temporal representation of the power spectrum of this signal. The device D therefore makes it possible to map the spectrum over time (frequency-to-time mapping) in real time.

Preferably, in this first variant, the analog low-pass filter LP is designed to filter frequencies of the photocurrent that are lower than a value min $[N\times|f_1-f_2|; f_1/2; f_2/2)]$, before the computing of the square modulus of the photocurrent by the processor UT. Filtering the frequencies lower than $N\times|f_1-f_2|$ makes it possible, if this value is lower than the Nyquist frequencies $f_1/2; f_2/2$, to process the photocurrent Tr with a processor comprising slower processing electronics (typically 50 Msample/s).

In this first variant, the frequency resolution of the device is $\Delta_f=1/(N(\tau_1-\tau_2))=LS_{in}/N$. It will thus be understood that, in order to obtain a suitable spectral resolution $\Delta_f$ while maintaining a high bandwidth $LS_{in}$, it is necessary to maximize the maximum number of return trips in the first and the second cavity BDF1, BDF2. Preferably, in order to obtain a suitable spectral resolution, the first and the second cavity are configured such that a maximum number of round trips N is greater than 200, preferably greater than 500. Typically, for a bandwidth of $LS_{in}=20$ GHz, and N=400, the frequency resolution of the device is $\Delta_f=50$ MHz.

In a second variant of the invention, the first cavity and the second cavity are configured to verify the condition $f_1\times\tau_1\neq f_2\times\tau_2$, modulo 1. This difference should be much less than 1, that is to say that: $f_1\tau_1=f_2\tau_2+\varepsilon$, $|\varepsilon|\ll 1$ (see equations at the end of the description). In this second variant, the trace TT is then a temporal representation of the real part of the fractional Fourier transform (FrFT) of the signal of interest. The order of the fractional transform represented by the device D is set by the difference $f_1\times\tau_1-f_2\times\tau_2$. More specifically, when $f_1\times\tau_1=f_2\times\tau_2$ modulo 1 (first variant of the invention), the photocurrent is a temporal representation of the real part of the Fourier transform of the input signal (that is to say order of the FrFT corresponding to $\pi/2$) while, when $f_1\times\tau_1-f_2\times\tau_2$ has a value close to 0 (second variant), the photocurrent represents the real part of the FrFT of the signal of interest. In concrete terms, the order of the FrFT depends on the scale factor $(f_2-f_1)/(\tau_1-\tau_2)$ (see the equations at the end of the description).

In this second variant of the invention, it is possible to define a frequency resolution by considering two signals with linear frequency modulation, that are simultaneous and that have the same chirp rate (that is to say the same slope in the time-frequency plane). These two signals therefore differ in terms of starting frequency. By choosing the correct order of the FrFT, the FrFT of these chirped signals consists of two peaks, the spacing between which is proportional to the frequency difference between these two chirped signals. The resolution of the device in the second variant of the invention then corresponds to the smallest value of the frequency difference between the two chirps able to be measured by the device. This definition makes it possible to define a resolution for this system that is a frequency.

Thus, depending on the value of the difference $f_1 \times \tau_1 - f_2 \times \tau_2$, the device D of the invention makes it possible to obtain a real-time temporal representation of two different items of frequency information of the signal of interest: the real part of the FrFT or the power spectrum.

The temporal resolution of the device (that is to say the time taken by the system to compute and produce the frequency information) is equal to $1/(f_2 - f_1)$. It should be noted that the frequency information is obtained in real time, that is to say that the determined frequency information is updated every period $1/(f_2 - f_1)$.

According to one embodiment, the first cavity comprises a first controllable delay line DL1 (not shown) designed to vary the first trip time $\tau_1$ and/or the second cavity comprises a first controllable delay line DL2 (not shown) designed to vary the second trip time $\tau_2$. It is thus possible to reduce the difference $(\tau_1 - \tau_2)$ in order to maximize the bandwidth $LS_{in}$ of the device D. Preferably, the difference $(\tau_1 - \tau_2)$ is such that the bandwidth $LS_{in}$ is greater than or equal to 20 GHz, preferably greater than or equal to 40 GHz. This bandwidth value is not achievable in the device described in the document "de Chatellus, Hugues Guillet, Luis Romero Cortés, and José Azaña. "Optical real-time Fourier transformation with kilohertz resolutions." *Optica* 3.1 (2016): 1-8", where the bandwidth of the device is of the order of 10 MHz as it is set by $1/\tau_1$.

One advantage of the embodiments of the invention comprising delay lines DL1, DL2 and/or frequency shifters AOM1, AOM2 that make it possible to vary $f_1$ and $f_2$ is that of making it possible to control the difference $f_1 \times \tau_1 - f_2 \times \tau_2$. It is thus possible to switch the operation of the device from the first variant of the invention to the second variant of the invention or vice versa. Moreover, controlling the difference $f_1 \times \tau_1 - f_2 \times \tau_2$ makes it possible to choose the order of the FrFT of the signal of interest.

It should be noted that, in the embodiments of the invention in which the first and the second cavity BDF1, BDF2 respectively comprise a first and second bandpass filter BP1, BP2, the bandwidth $LS_{in}$ is equal to a spectral width $LS_{BP}$ of the first and of the second bandpass filter when this spectral width $LS_{BP}$ is less than $1/(\tau_1 - \tau_2)$. In other words, the bandwidth is equal to $LS_{in} = \min (1/(\tau_1 - \tau_2); LS_{BP})$.

Notably, the device D does not perform any truncation or sampling on the spectrum of the signal of interest that reduces the analyzed part of the spectrum. Thus, unlike some of the abovementioned devices from the prior art, the device D of the invention has a POI of 100% and the frequency information of the signal of interest represented by the trace TT is representative of the entire spectrum of the signal of interest within the bandwidth.

Figure 1:
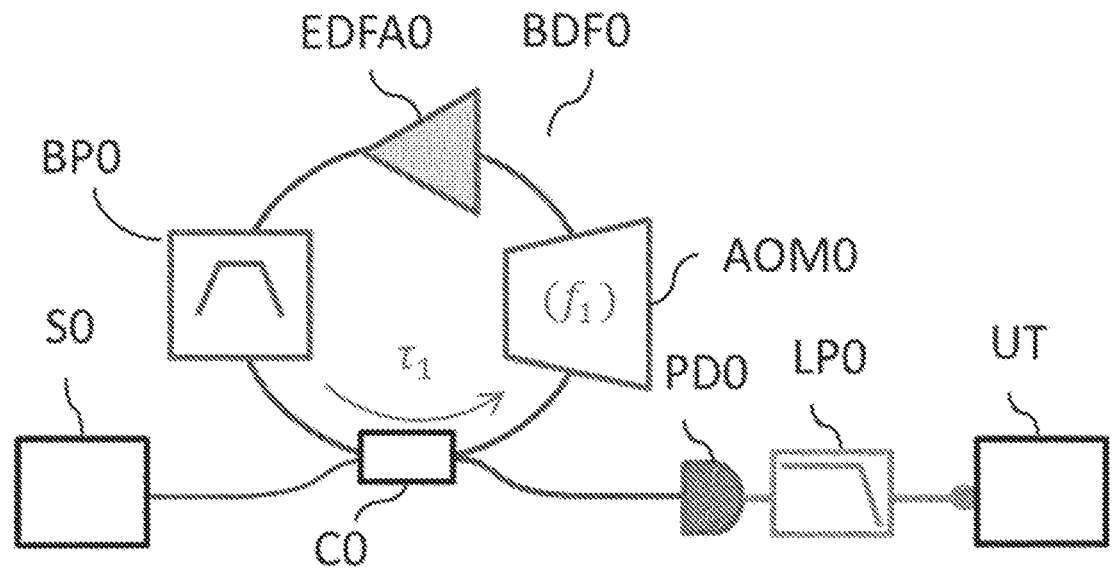
FIG. 1 shows a schematic view of a spectral analysis device from the prior art.

According to one embodiment, the first and the second cavity respectively comprise a first and a second amplifier EDFA1, EDFA2 (not shown in FIG. 1 but visible in FIG. 4) that are designed to compensate for the losses induced by the first and the second cavity.

Figure 3:
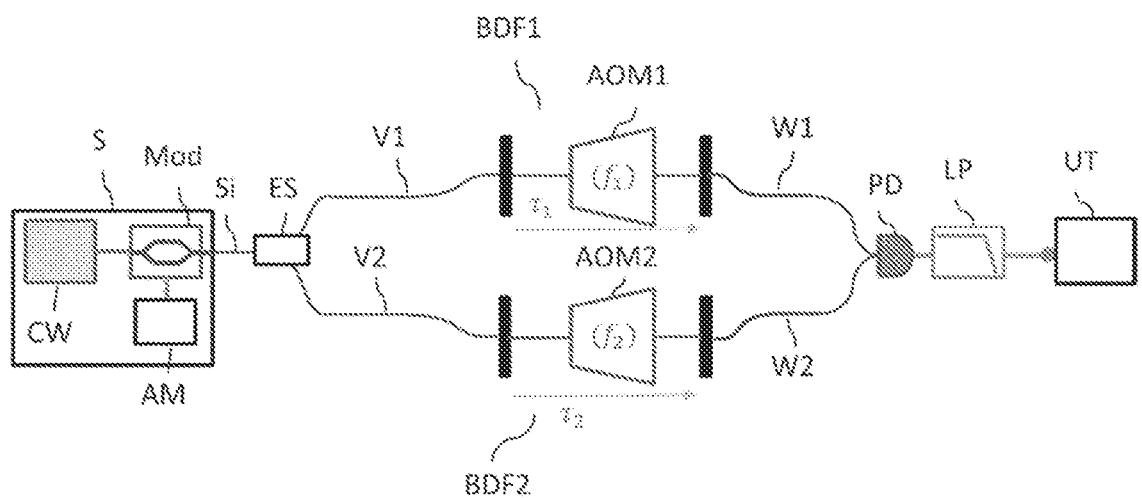
FIG. 3 shows a schematic view of a wideband spectral analysis device according to a first embodiment of the invention.

According to a first embodiment of the invention, illustrated in FIG. 3, the source S comprises a monochromatic continuous-wave laser CW, an RF source AM designed to generate an RF signal s(t), and a modulator Mod designed to amplitude-modulate or phase-modulate, using the RF signal s(t), the laser radiation generated by the continuous-wave laser so as to form said signal of interest. In the first embodiment of the invention, the device D makes it possible to determine a temporal representation of frequency information of the RF signal s(t) carried by the continuous-wave laser. Thus, according to the second variant of the invention, the trace TT is then a temporal representation of the FrFT of the RF signal s(t) and, according to the first variant of the invention, the trace TT is then a temporal representation of the convolution product of the power spectrum of the monochromatic laser CW and the power spectrum of the RF signal s(t). When the laser CW has a coherence time long enough for the radiation to remain coherent within the cavities BDF1, BDF2 (typically of the order of around one hundred μs), then the trace TT is then a temporal representation of the real part of the spectrum of the RF signal s(t). This first embodiment is of particular interest given the bandwidth $LS_{in}$ of the device, which may be greater than 40 GHz while at the same time having a POI of 100%, these values not being unachievable using the devices from the prior art carrying out spectral analysis of RF signals.

In a second embodiment, the source S is a coherent optical source generating a signal of interest Si in the form of light radiation s(t), for example a laser source. In the second embodiment of the invention, the device D makes it possible to determine a temporal representation of frequency information of the signal s(t).

Figure 4:
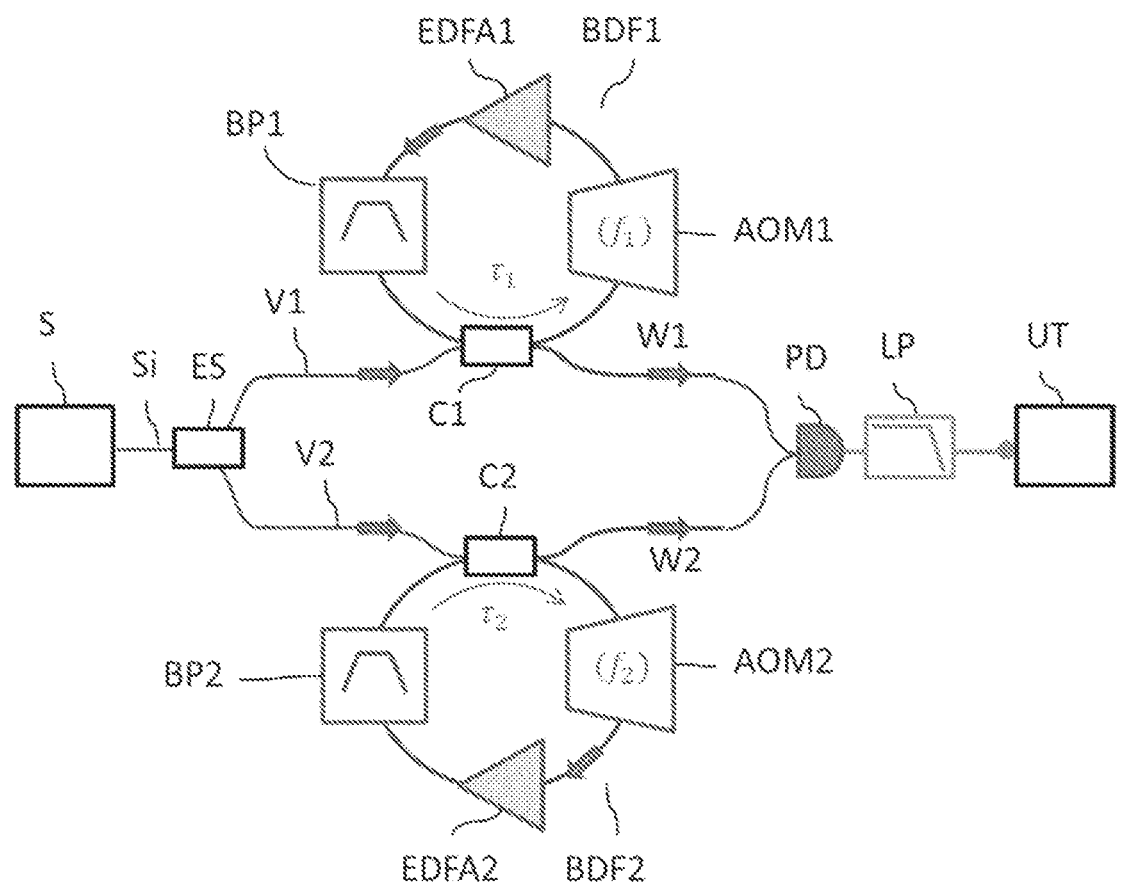
FIG. 4 shows a schematic view of a wideband spectral analysis device according to a third embodiment of the invention.

FIG. 4 schematically illustrates a third embodiment, compatible with the first and the second embodiment, in which the entire optical path of the signal of interest from the source to the detection by the photodiode is fiber-based. The alignment of the device is thus simplified, and the device is less sensitive to impacts and vibrations. In this third embodiment, the signal of interest Si is split, by a Y coupler ES, so as to form the first signal V1 and the second signal V2, both guided in a respective optical fiber. The first and the second cavity BDF1, BDF2 are fiber ring cavities comprising, respectively, a first and a second doped fiber amplifier EDFA1, EDFA2 and a first and a second optical bandpass filter BP1, BP2. The first signal V1 is injected into the first cavity BDF1 by way of a fiber coupler C1 and the second signal V2 is injected into the second cavity BDF2 by way of a fiber coupler C2.

As explained above, the first and the second doped fiber amplifier EDFA1, EDFA2, for example EDFAs, are designed to compensate for the losses induced in the cavities BDF1, BDF2. The optical bandpass filters BP1, BP2 are configured to set said maximum number N of round trips in the first and the second cavity and to limit the noise resulting from the amplified spontaneous emission of the doped fiber amplifiers.

Advantageously, in the third embodiment, the device D comprises stabilization means ST (not shown) for stabilizing the first and the second cavity BDF1, BDF2 that are designed to maintain, over time, the coherence between the first signal transmitted by the first cavity and the second signal transmitted by the second cavity. The stabilization device makes it possible to ensure that the radiation transmitted by the two cavities BDF1, BDF2 is mutually coherent. Such a device is well known to those skilled in the art and is for example described in "Coherent multi-heterodyne spectroscopy using acousto-optic frequency combs," Opt. Express 26, 13800-13809 (2018).

Figure 5:
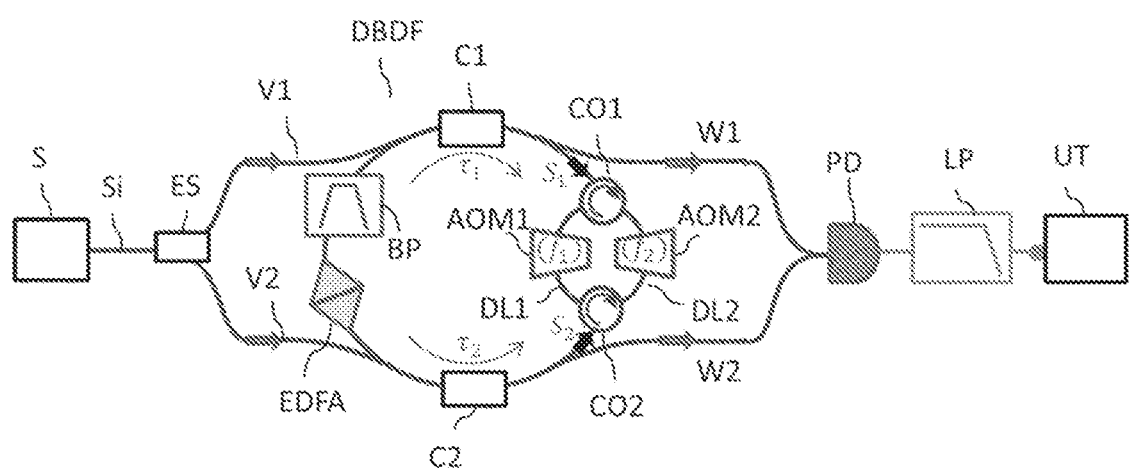
FIG. 5 shows a schematic view of a wideband spectral analysis device according to a fourth embodiment of the invention.

FIG. 5 schematically illustrates a fourth embodiment, compatible with the first and the second embodiment, which constitutes an alternative to the third embodiment. This fourth embodiment aims to overcome the problem of maintaining coherence over time between the first signal W1 and the second signal W2 transmitted by the first and the second cavity. For this purpose, the device comprises a single fiber ring cavity BDF configured to form the first and the second cavity BDF1, BDF2 in the injection direction. This configuration with a single counter-propagating ring cavity makes it possible to limit the effects of fiber length fluctuations (vibrations, thermal drifts, etc.), which may be different between the first and the second cavity of the third embodiment, and which lead to a loss of coherence as the round trips progress. It also makes it possible to reduce the number of optical components needed.

Similarly to the third embodiment, in the device D of the fourth embodiment, the entire optical path of the signal of interest from the source to the detection by the photodiode is fiber-based. The device D comprises a first fiber coupler C1 designed to inject the first signal V1 into the single cavity BDF in a first direction $S_1$. In addition, the device D comprises a second fiber coupler C2 designed to inject the second signal V2 into the single cavity BDF in a second direction $S_2$. The cavity BDF comprises:
- a first circulator CO1 designed to direct the first signal V1 to a first delay line DL1 comprising the first frequency shifter AOM1,
- a second circulator CO2 designed to direct the second signal to the second delay line DL2 comprising the second frequency shifter AOM2,
- a bidirectional doped fiber amplifier EDFA (operating in both directions),
- an optical bandpass filter BP configured to set said maximum number N of round trips. Thus, the first cavity BDF1 corresponds to the single cavity BDF into which the first signal V1 is injected in the first injection direction $S_1$ and the second cavity BDF2 corresponds to the single cavity BDF into which the second signal V2 is injected in the second injection direction $S_2$.

As an alternative, according to one variant of the fourth embodiment, instead of a single amplifier EDFA and a single optical bandpass filter BP common to the first signal V1 and to the second signal V2, the first delay line DL1 comprises a first amplifier EDFA1 and an optical bandpass BP1 and the second delay line DL1 comprises a second amplifier EDFA2 and an optical bandpass BP2.

It will be understood that the embodiments of FIGS. 3 to 5 are compatible with the first and second variant of the invention according to the value of the difference $f_1 \times \tau_1 - f_2 \times \tau_2$.

Figure 6:
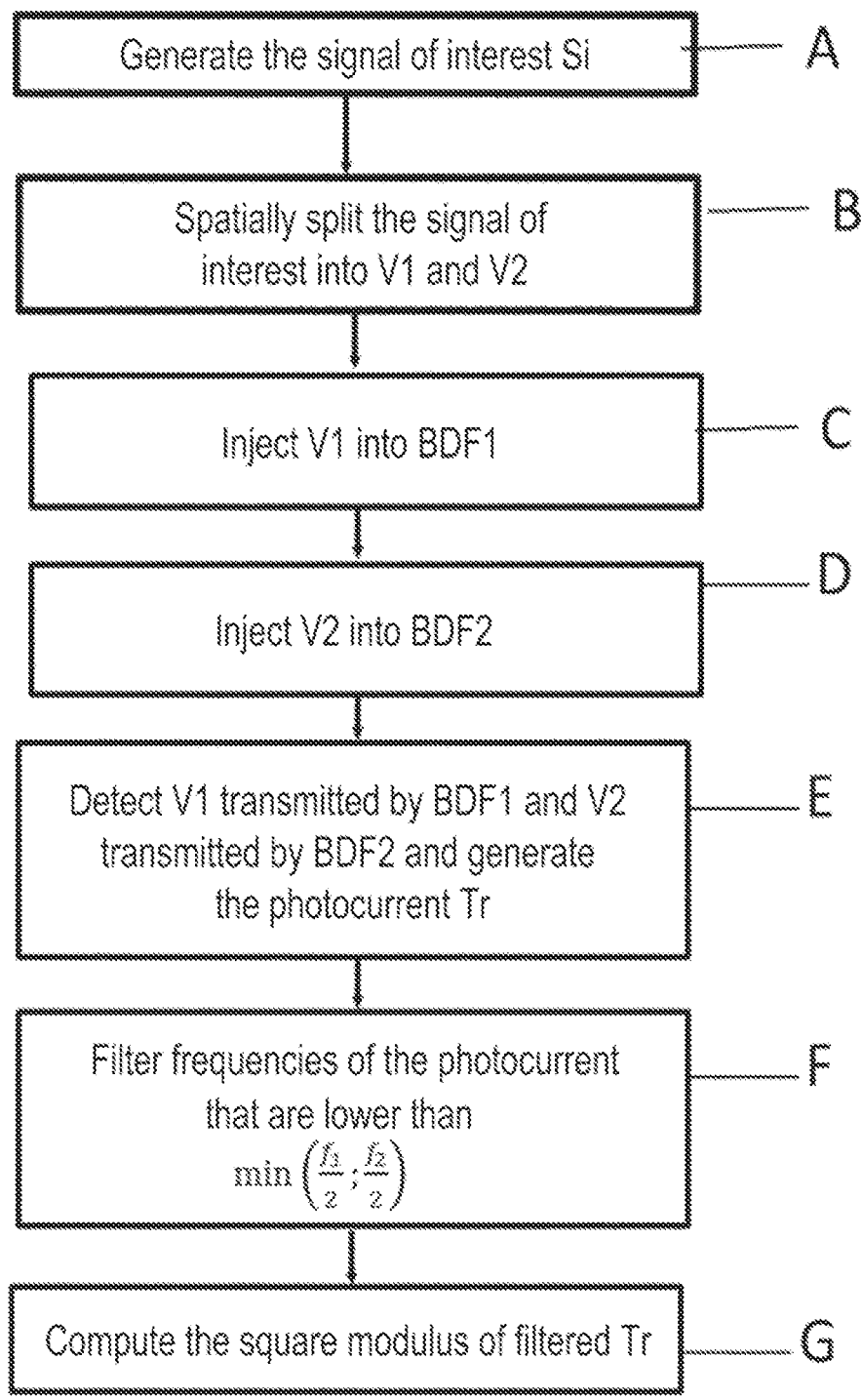
FIG. 6 shows a spectral analysis method according to the invention.

Another subject of the invention is a method for the spectral analysis of a signal of interest Si implemented by the device D of the invention. FIG. 6 schematically illustrates this method, which allows a temporal representation of frequency information (FrFT or power spectrum) of the signal of interest on the basis of the value of the difference $f_1 \times \tau_1 - f_2 \times \tau_2$.

The method of FIG. 6 comprises the following steps:
A. generating the signal of interest Si;
B. spatially splitting the signal of interest into the first signal V1 and the second signal V2;
C. injecting the first signal into the first frequency-shifting optical cavity BDF1 and shifting the optical frequency of the first signal by a first frequency $f_1$ per round trip in the first cavity
D. injecting the second signal into the second frequency-shifting optical cavity BDF2 and shifting the optical frequency of the second signal by a second frequency $f_2$ per round trip in the second cavity;
E. coherently detecting the first signal W1 transmitted by the first cavity and the second signal W2 transmitted by the second cavity and generating the photocurrent Tr proportional to the detected luminous intensity,
F. filtering frequencies of the photocurrent that are lower than min
G. computing the square modulus of the filtered photocurrent, based on which a temporal representation of frequency information of said signal of interest is determined.

The method of FIG. 6 has the notable advantage of being wideband, of having a POI of 100% and good frequency resolution.

According to a first variant of the method of FIG. 6, the method comprises a step prior to step A), denoted step A0), of adjusting the first or the second cavity in order to cancel out the difference $f_1 \times \tau_1 - f_2 \times \tau_2$, so as to compute, in step G, a power spectrum of the signal of interest. This first variant is implemented by the first variant of the device of the invention.

According to a second variant of the method of FIG. 6, the method comprises a step prior to step A), denoted step A0), of adjusting the first or the second cavity in order to set the difference $f_1 \times \tau_1 - f_2 \times \tau_2$ to a desired non-zero value, in order to compute, in step G, a specific order of the real part of a fractional Fourier transform of the signal of interest. This second variant is implemented by the second variant of the device of the invention.

The equations demonstrating that, depending on the value of the difference $f_1 \times \tau_1 - f_2 \times \tau_2$, the trace TT is the real part of a fractional Fourier transform or a power spectrum of the signal of interest, are derived below.

$f_0$ denotes the frequency of the injection laser, $\tau_1$, $\tau_2$ denote the trip times in the loops, $f_1$, $f_2$ denote the shift frequencies per trip and s(t) denotes the signal of interest.

The electric fields at the output of the first and the second cavity are respectively:

$$E_1(t)=\Sigma_{n=0}^{N} s(t-n\tau_1)\Sigma_0 e^{i2\pi f_0 t} e^{i2\pi n f_1 t} e^{-i\pi f_1\tau_1 n^2} \quad (1)$$

$$E_2(t)=\Sigma_{n=0}^{N} s(t-n\tau_2)\Sigma_0 e^{i2\pi f_0 t} e^{i2\pi n f_2 t} e^{-i\pi f_2\tau_2 n^2} \quad (2)$$

The intensity detected by PD is:

$$l(t)=w(t)*E_1(t)E_2*(t) \quad (3)$$

where w(t) is a time window centered at t (linked to the response of the detection) and * is the convolution product. Omitting the term $E_0 E_0*$ gives $$l(t)=w(t)*\Sigma_{n,m} s(t-n\tau_1)s(t-m\tau_2)e^{i2\pi(nf_1-mf_2)t} e^{-i\pi(f_1\tau_1 n^2-f_2\tau_2 m^2)} \quad (4)$$

$$I(t)=\int w(t-t')\Sigma_{n,m} s(t'-n\tau_1)s(t'-m\tau_2)e^{i2\pi(nf_1-mf_2)t'} e^{-i\pi(f_1\tau_1 n^2-f_2\tau_2 m^2)} dt' \quad (5)$$

The frequencies $f_1$ and $f_2$ are chosen such that $\Delta f = f_2 - f_1 \leq f_1/2N, f_2/2N$. The duration of the window w(t) is chosen to be of the order of $1/N\Delta f$. It is therefore greater than $2/f_1$ and $2/f_1$. Thus, only pairs of integers (n, m=n) have a non-zero contribution to the integral.

First Variant of the Invention:

It is assumed here that $f_1\tau_1 = f_2\tau_2$ This then gives:

$$I(t)=\int w(t-t')\Sigma_n s(t'-n\tau_1)s(t'-n\tau_2)e^{-i2\pi n\Delta f t'} dt' \quad (6)$$

Over the duration of the window, $e^{-i2\pi n\Delta f t'}$ may be assimilated to $e^{-i2\pi n\Delta f t}$ because the duration of the window is shorter than the period of the functions $e^{-i2\pi n\Delta f t'}$.

This thus gives:

$$I(t)=\Sigma_n e^{-i2\pi n\Delta f t} \int w(t-t')s(t'-n\tau_1)s(t'-n\tau_2) dt' \quad (7)$$

$$I(t)=\Sigma_n <s(t-n\tau_1)s(t-n\tau_2)> e^{-i2\pi n\Delta f t} \quad (8)$$

where < > represents the average measured over the duration of the window.

Shifting the time origin gives $$I(t)=\sum_n <s(t)s(t-n\tau)>e^{-i2\pi n\Delta ft} \quad (9)$$

where $\Delta\tau=\tau_2\tau_1$. The correlation function at the time t for the delay T is defined:

$$C(t,T)=<s(t)s(t-T)>.$$

That is to say $I(t)=\sum_n C(t,n\Delta\tau)e^{-i2\pi n\Delta ft}$ (10)

It is written that, defining $\delta(t)$ as the Dirac delta function:

$$I(t) = \sum_n \int C(t, t') e^{-i2\pi\frac{\Delta f}{\Delta\tau}t't} \delta(t' - n\Delta\tau) dt' = \quad (11)$$

$$\int \mathcal{C}(t, t')e^{-i2\pi\frac{\Delta f}{\Delta\tau}t't}\sum_n e^{i2\pi n\frac{t'}{\Delta\tau}} dt' = \sum_n \int \mathcal{C}(t, t') e^{-i2\pi\left(\frac{\Delta f}{\Delta\tau}t-\frac{n}{\Delta\tau}\right)t'} dt'$$

and finally:

$$I(t) = \sum_n \tilde{C}\left(t, \frac{\Delta f}{\Delta\tau}t - \frac{n}{\Delta\tau}\right) \quad (12)$$

where $\tilde{C}(t,f)=\int \mathcal{C}(t,t')e^{-i2\pi ft'}dt'$ is the Fourier transform (FT) of $\mathcal{C}(t, t')$ with respect to the variable t'.

I(t) is therefore a repetition of the FT of the autocorrelation function at the time t projected over time, that is to say, using the Wiener-Khintchine theorem, the power spectrum of the input signal at the time t. It should be noted here that the signal actually measured by the detector PD is actually 2Re(I(t)). The power spectrum is obtained via a Hilbert transformation of the measured signal.

The period of the output signal is $1/\Delta f$. This therefore gives the spectrum of the input signal projected into the time domain ("frequency-to-time mapping"). The proportionality coefficient is simply $\Delta\tau/\Delta f=(f_2-f_1)/(\tau_1-\tau_2)$.

The temporal resolution is given by the duration of the window w(t), that is to say of the order of $1/N\Delta f$. The spectral resolution is therefore:

$$\delta f = \frac{\Delta f}{\Delta\tau}\frac{1}{N\Delta f} = \frac{1}{N\Delta\tau}$$

The spectral width of s(t) able to be measured unambiguously is $1/\Delta\tau$.

It should be noted that this result is valid when for all values of $f_1\tau_1=f_2\tau_2$ modulo 1 (see equation 5). Modulo 1 is understood here to mean $f_1\tau_1=f_2\tau_2+k$, with $k\in \mathbb{N}$.

Second Variant of the Invention:

It is now assumed that: $f_1\tau_1=f_2\tau_2+\varepsilon$, ($|\varepsilon|<<1$) giving:

$$I(t) = \sum_n C(t, n\Delta\tau) e^{-i2\pi n\Delta ft} e^{-i\pi\varepsilon n^2} \quad (13)$$

Following the same process:

$$I(t) = \sum_n \int C(t, t') e^{-i2\pi\frac{\Delta f}{\Delta\tau}t't} e^{-i\pi\varepsilon\frac{t'^2}{\Delta\tau^2}} \delta(t' - n\Delta\tau) dt' \quad (14)$$

-continued $$= \int \mathcal{C}(t, t')e^{-i2\pi\frac{\Delta f}{\Delta\tau}t't} e^{-i\pi\varepsilon\frac{t'^2}{\Delta\tau^2}}\sum_n e^{i2\pi n\frac{t'}{\Delta\tau}} dt'$$

$$= \sum_n \int \mathcal{C}(t, t') e^{-i2\pi\left(\frac{\Delta f}{\Delta\tau}t-\frac{n}{\Delta\tau}\right)t'} e^{-i\pi\varepsilon\frac{t'^2}{\Delta\tau^2}} dt'$$

To give a fractional FT, $y=t'/\Delta\tau$ is set. This therefore gives:

$$I(t) \propto \sum_n \int C(t, y) e^{-i2\pi(\Delta ft-n)y} e^{-i\pi\varepsilon y^2} dy \quad (15)$$

The expression of the fractional FT (FrFT) of the function C is recognized (apart from a quadratic phase term that would be in the form $e^{i\beta r^2}$). Here, the order $\alpha$ of the FrFT is given by: $\cot \alpha=2\pi\varepsilon$. It should be noted that the definition of the parameter y here defines the order of the FrFT.

Finally, I(t) is therefore the repetition of the FrFT of the autocorrelation function at the time t projected over time, that is to say, using the convolution theorem applied to the FrFT, the square modulus of the FrFT of the input signal.

As before, the signal actually measured by the detector is actually 2Re(I(t)), which means that the square modulus of the FrFT is obtained via a Hilbert transformation of the measured signal.

The period of the output signal is $1/\Delta f$. This therefore gives the FrFT of the input signal projected into the time domain ("fractional frequency-to-time mapping").

The invention claimed is:

1. A wideband device (D) for the spectral analysis of a signal of interest comprising:
  a source(S) designed to generate said signal of interest (Si);
  an optical splitter element (ES) designed to spatially split said signal of interest into a first signal (V1) and a second signal (V2);
  a first frequency-shifting optical cavity (DBDF, BDF1) comprising a first frequency shifter (AOM1) designed to shift the optical frequency of the first signal by a first frequency $f_1$ per round trip in said first cavity, said first cavity having a first trip time $\tau_1$;
  a second frequency-shifting optical cavity (DBDF, BDF2) comprising a second frequency shifter (AOM2) designed to shift the optical frequency of the second signal by a second frequency $f_2$ per round trip in said second cavity, said second cavity having a second trip time $\tau_2$;
  the first and the second optical cavity being designed such that a maximum number of round trips of said signal in the first and the second cavity is equal to predetermined N;
  a detector (PD) designed to coherently detect the first signal (W1) transmitted by the first cavity and the second signal (W2) transmitted by the second cavity and generate a photocurrent (Tr) proportional to a luminous intensity detected by said detector, a low-pass filter (LP) designed to filter frequencies of the photocurrent that are lower than min ($f_1/2$, $f_2/2$), a processor (UT) configured to compute a square modulus of the photocurrent filtered by said low-pass filter, from which a temporal representation of frequency information of said signal of interest is determined, said frequency information being:

a real part of a fractional Fourier transform of said signal of interest, an order of said fractional Fourier transform being set by the value $f_1 \times \tau_1 - f_2 \times \tau_2$ when the first cavity and the second cavity are configured to verify the condition $f_1 \times \tau_1 + f_2 \times \tau_2$, modulo 1 or a power spectrum of said signal of interest when the first cavity and the second cavity are configured to verify the condition $f_1 \times \tau_1 = f_2 \times \tau_2$ modulo 1.

2. The device as claimed in claim 1, wherein said source comprises a monochromatic continuous-wave laser (CW), an RF source (AM) designed to generate an RF signal s(t), and a modulator (Mod) designed to amplitude-modulate or phase-modulate, using said RF signal s(t), laser radiation generated by said continuous-wave laser, so as to form said signal of interest.

3. The device as claimed in claim 1, wherein the analog low-pass filter (LP) is designed to filter frequencies of said photocurrent that are lower than min $[N \times |f_1-f_2|; f_1/2; f_2/2]$, when the first cavity and the second cavity are configured to verify the condition $f_1 \times \tau_1 = f_2 \times \tau_2$ modulo 1.

4. The device as claimed in claim 1, wherein the first and the second cavity respectively comprise a first and a second amplifier (EDFA, EDFA1, EDFA2) designed to compensate for the losses induced respectively by the first and the second cavity.

5. The device as claimed in claim 1, wherein the first frequency shifter is a first acousto-optic modulator excited by a first local oscillator (OL1) designed to vary said first shift frequency and wherein the second frequency shifter is a second acousto-optic modulator excited by a second local oscillator (OL2) designed to vary said second shift frequency.

6. The device as claimed in claim 1, wherein the first cavity comprises a first controllable delay line (DL1) designed to vary the first trip time $\tau_1$ and wherein the second cavity comprises a second controllable delay line (DL2) designed to vary the second trip time $\tau_2$.

7. The device as claimed in claim 6, comprising a single ring cavity (BDF), said device furthermore comprising:
a first coupler (C1) designed to inject said first signal (V1) into said single cavity in a first direction,
a second coupler (C2) designed to inject said second signal (V2) into said single cavity in a second direction,
said first cavity corresponding to the single cavity into which the first signal is injected in the first injection direction,
said second cavity corresponding to the single cavity into which the second signal is injected in the second injection direction,
said single ring cavity comprising:
a first circulator (CO1) designed to direct the first signal to a first controllable delay line (DL1) designed to vary the first trip time $\tau_1$ and comprising said first frequency shifter (AOM1),
a second circulator (CO2) designed to direct the second signal to a second controllable delay line (DL2) designed to vary the second trip time $\tau_1$ and comprising said second frequency shifter (AOM2),
a doped fiber amplifier (EDFA),
an optical bandpass filter (BP) configured to set said maximum number N of round trips.

8. The device as claimed in claim 1, wherein the first and the second cavity are fiber ring cavities (BDF1, BDF2) comprising respectively a first and a second doped fiber amplifier (EDFA1, EDFA2) and a first and a second optical bandpass filter (BP1, BP2) configured to set said maximum number N of round trips in the first and the second cavity.

9. The device as claimed in claim 8, comprising stabilizing means (ST) for stabilizing the first and the second cavity that are designed to maintain, over time, the coherence of said first signal transmitted by the first cavity with said second signal transmitted by the second cavity.

10. The device as claimed in claim 1, wherein the first and the second cavity are configured such that $1/|\tau_1-\tau_2| \geq 40$ GHz.

11. The device as claimed in claim 1, wherein the first and the second cavity are configured such that N is greater than 200.

12. A method for the spectral analysis of a signal of interest (Si) using a first frequency-shifting optical cavity (BDF1) comprising a first frequency shifter (AOM1) having a first trip time $\tau_1$ and a second frequency-shifting optical cavity (BDF2) comprising a second frequency shifter (AOM2) having a second trip time $\tau_2$, a maximum number of round trips of said signal of interest in the first and the second cavity being equal to predetermined N, said method comprising the following steps:
A. generating said signal of interest;
B. spatially splitting said signal of interest into a first signal (V1) and a second signal (V2);
C. injecting said first signal into the first frequency-shifting optical cavity (BDF1) and shifting the optical frequency of the first signal by a first frequency $f_1$ per round trip in said first cavity;
D. injecting said second signal into the second frequency-shifting optical cavity (BDF2) and shifting the optical frequency of the second signal by a second frequency $f_2$ per round trip in said second cavity;
E. coherently detecting the first signal transmitted by the first cavity (W1) and the second signal (W2) transmitted by the second cavity and generating a photocurrent (Tr) proportional to a detected luminous intensity,
F. filtering frequencies of the photocurrent that are lower than min $(f_1/2; f_2/2)$,
G. computing a square modulus of the filtered photocurrent and determining a temporal representation of frequency information of said signal of interest, said method comprising a step prior to step A, denoted step A0, of:
adjusting the first or the second cavity in order to set a difference $f_1 \times \tau_1 - f_2 \times \tau_2$ to a desired non-zero value, in order to compute, in step G, a specific order of a real part of a fractional Fourier transform of the signal of interest, or
adjusting the first or the second cavity in order to cancel out a difference $f_1 \times \tau_1 - f_2 \times \tau_2$, in order to compute, in step G, a power spectrum of said signal of interest.

* * * * *